(12) United States Patent
Lee

(10) Patent No.: US 12,119,333 B2
(45) Date of Patent: Oct. 15, 2024

(54) DISPLAY APPARATUS USING SEMICONDUCTOR LIGHT-EMITTING DEVICE

(71) Applicant: LG ELECTRONICS INC., Seoul (KR)

(72) Inventor: Yonghan Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/014,900

(22) PCT Filed: Jul. 8, 2020

(86) PCT No.: PCT/KR2020/008931
§ 371 (c)(1),
(2) Date: Jan. 6, 2023

(87) PCT Pub. No.: WO2022/010007
PCT Pub. Date: Jan. 13, 2022

(65) Prior Publication Data
US 2023/0253387 A1 Aug. 10, 2023

(51) Int. Cl.
*H01L 25/16* (2023.01)
*G09G 3/32* (2016.01)

(52) U.S. Cl.
CPC .............. *H01L 25/167* (2013.01); *G09G 3/32* (2013.01); *G09G 2300/0408* (2013.01); *G09G 2310/0281* (2013.01)

(58) Field of Classification Search
CPC .................... H01L 25/167; G09G 3/32; G09G 2300/0408; G09G 2310/0281

USPC ......................................................... 345/206
See application file for complete search history.

(56) References Cited

U.S. PATENT DOCUMENTS

| | | | |
|---|---|---|---|
| 2009/0073079 A1* | 3/2009 | Miller | H10K 59/18 345/1.3 |
| 2018/0323180 A1* | 11/2018 | Cok | H01L 23/5386 |
| 2019/0347985 A1* | 11/2019 | Shaeffer | G09G 3/2003 |
| 2020/0020751 A1* | 1/2020 | Cho | H10K 59/131 |

FOREIGN PATENT DOCUMENTS

| | | |
|---|---|---|
| KR | 10-2018-0093767 A | 8/2018 |
| KR | 10-2019-0026617 A | 3/2019 |
| KR | 10-2020-0005942 A | 1/2020 |
| KR | 10-2020-0067399 A | 6/2020 |
| WO | WO 2016/018536 A9 | 2/2016 |

* cited by examiner

*Primary Examiner* — Mark Edwards
(74) *Attorney, Agent, or Firm* — Birch, Stewart, Kolasch & Birch, LLP

(57) ABSTRACT

The present disclosure relates to a display apparatus using a semiconductor light-emitting device, the display apparatus comprising: a base substrate; a row driver which provides 3-state first signals including a high, a ground, and a low signal; a column driver which provides 2-state second signals including a high and a low signal; and a plurality of semiconductor light-emitting devices provided on the base substrate, wherein the plurality of semiconductor light-emitting devices include a first semiconductor light-emitting device and a second semiconductor light-emitting device which are connected to the row driver and the column driver in different pole directions.

21 Claims, 19 Drawing Sheets

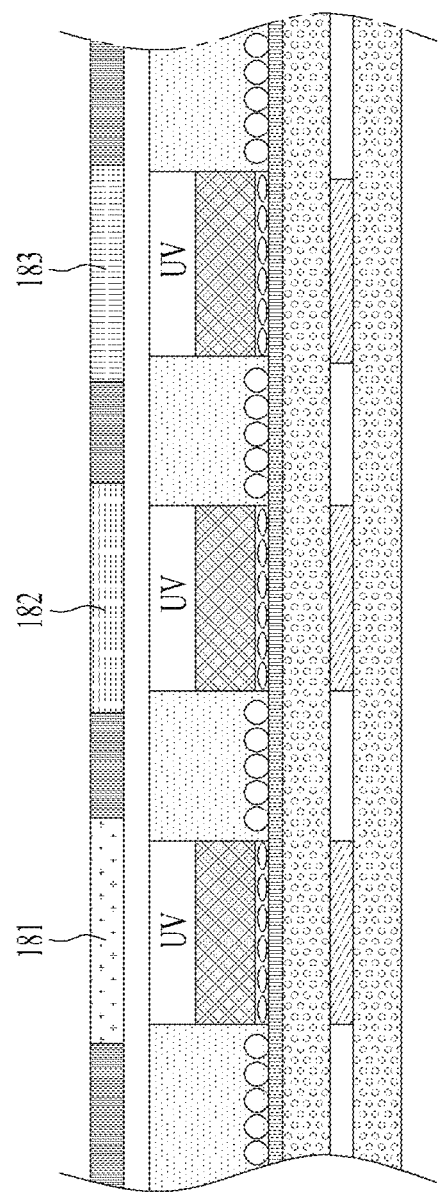

DISPLAY APPARATUS USING SEMICONDUCTOR LIGHT-EMITTING DEVICE

CROSS REFERENCE TO RELATED APPLICATIONS

This application is the National Phase of PCT/KR2020/008931 filed on Jul. 8, 2020, which is hereby expressly incorporated by reference into the present application.

TECHNICAL FIELD

The present disclosure relates to a display device using a semiconductor light emitting element. Here, the semiconductor light emitting element may correspond to a micro-light emitting diode (LED). The present disclosure relates to a circuit configuration for driving a semiconductor light emitting element.

BACKGROUND ART

Recently, in a field of a display technology, display devices having excellent characteristics such as thinness, flexibility, and the like have been developed. On the other hand, currently commercialized major displays are represented by an LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

To implement a display device using these semiconductor light emitting elements, a very large number of semiconductor light emitting elements are required. Therefore, considering manufacturing cost, the size of the individual semiconductor light emitting elements needs to be miniaturized to increase the number of semiconductor light emitting elements to be produced on a substrate of the same area.

Miniaturization of semiconductor light emitting elements causes difficulties in manufacturing driving substrates. For example, since the initial development cost (Non-recurring engineering (NRE)) for manufacturing a driving substrate is large, there is a problem that it is difficult to respond to various products such as small-type mass production, multi-type response production, and transparent/flexible production.

DISCLOSURE

Technical Problem

An objective of the present disclosure is to provide a display device using a semiconductor light emitting element.

An objective of an embodiment of the present disclosure is to easily respond to various display products using a modular interposer.

An objective of an embodiment of the present disclosure is to implement bezel-less of a display.

An objective of an embodiment of the present disclosure is to improve a display yield by enabling a pass/fail inspection in units of a modular interposer.

Furthermore, another object of an embodiment of the present disclosure is to overcome various problems not mentioned herein. One of skilled in the art may understand the entire meaning of the specification and drawings.

Technical Solution

To achieve the objective, a display device using a semiconductor light emitting element includes a base substrate, a first interposer provided on the base substrate and including a semiconductor light emitting element and an IC chip as a basic component, and a second interposer further including at least one of a row driver and a column driver in addition to the basic component.

According to an embodiment, the first interposer may be provided within a specific area of the base substrate, and the second interposer may be provided at an edge of the specific area.

According to an embodiment, the second interposer further including the row driver may be provided along a column-direction edge in the specific area.

According to an embodiment, the specific area may include the second interposer further including the row driver along both column-direction edges.

According to an embodiment, the second interposer further including the column driver may be provided along a row-direction edge in the specific area.

According to an embodiment, the specific area may include the second interposer further including the column driver along both row-direction edges.

According to an embodiment, the second interposer including both the column driver and the row driver may be provided at an edge in the specific area.

According to an embodiment, an area of the base substrate may be divided to configure the plurality of specific areas.

According to an embodiment, when a number of rows formed by the semiconductor light emitting elements is equal to or greater than a predetermined number, the base substrate may include the plurality of specific areas in a column direction.

According to an embodiment, when a number of columns formed by the semiconductor light emitting elements is equal to or greater than a predetermined number, the base substrate may include the plurality of specific areas in a row direction.

According to an embodiment, the row driver may provide the same first signal to IC chips listed in a row direction in the specific area.

According to an embodiment, the column driver may provide the same second signal to IC chips listed in a column direction in the specific area.

According to an embodiment, the IC chip may provide a light emitting signal to the semiconductor light emitting element included in an interposer in response to the signal provided by the row driver and the column driver.

According to an embodiment, the basic component may include a semiconductor light emitting element set including a red light semiconductor light emitting element, a blue light semiconductor light emitting element, and a green light semiconductor light emitting element in response to a unit pixel.

According to an embodiment, the basic component may include the plurality of semiconductor light emitting element sets.

Advantageous Effects

An embodiment of the present disclosure may provide a display device using a semiconductor light emitting element.

An embodiment of the present disclosure may respond to various display products using a modular interposer.

An embodiment of the present disclosure may implement bezel-less of a display.

An embodiment of the present disclosure may improve a display yield by enabling a pass/fail inspection in units of a modular interposer.

Furthermore, according to another embodiment of the present disclosure, there are additional technical effects not mentioned here. One of skilled in the art may understand the entire meaning of the specification and drawings.

DESCRIPTION OF DRAWINGS

FIGS. 5A to 5C are conceptual diagrams illustrating various examples of color implementation with respect to a flip-chip type semiconductor light emitting element;

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
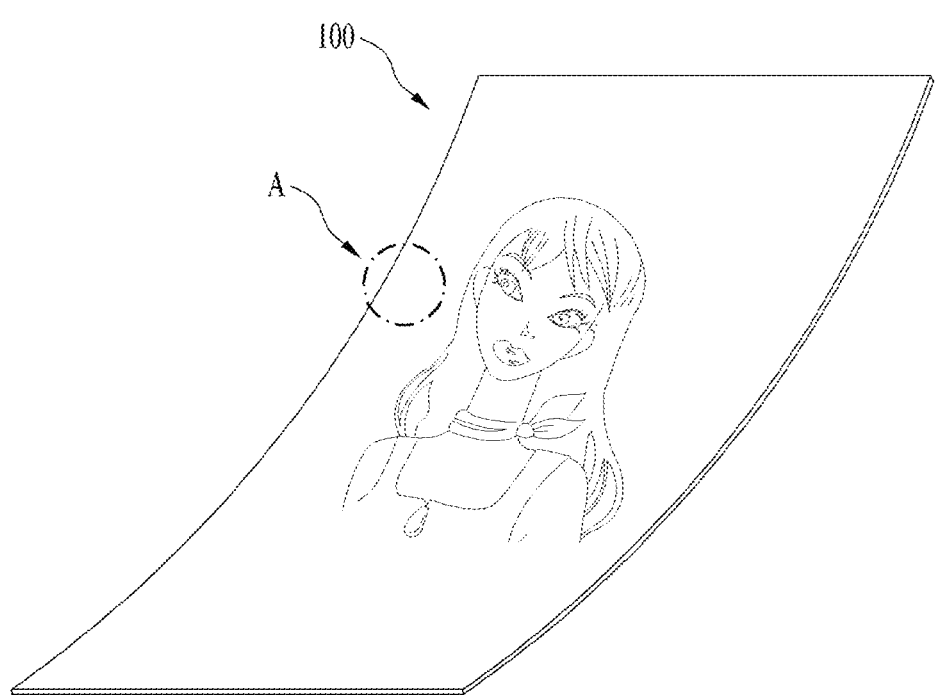
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
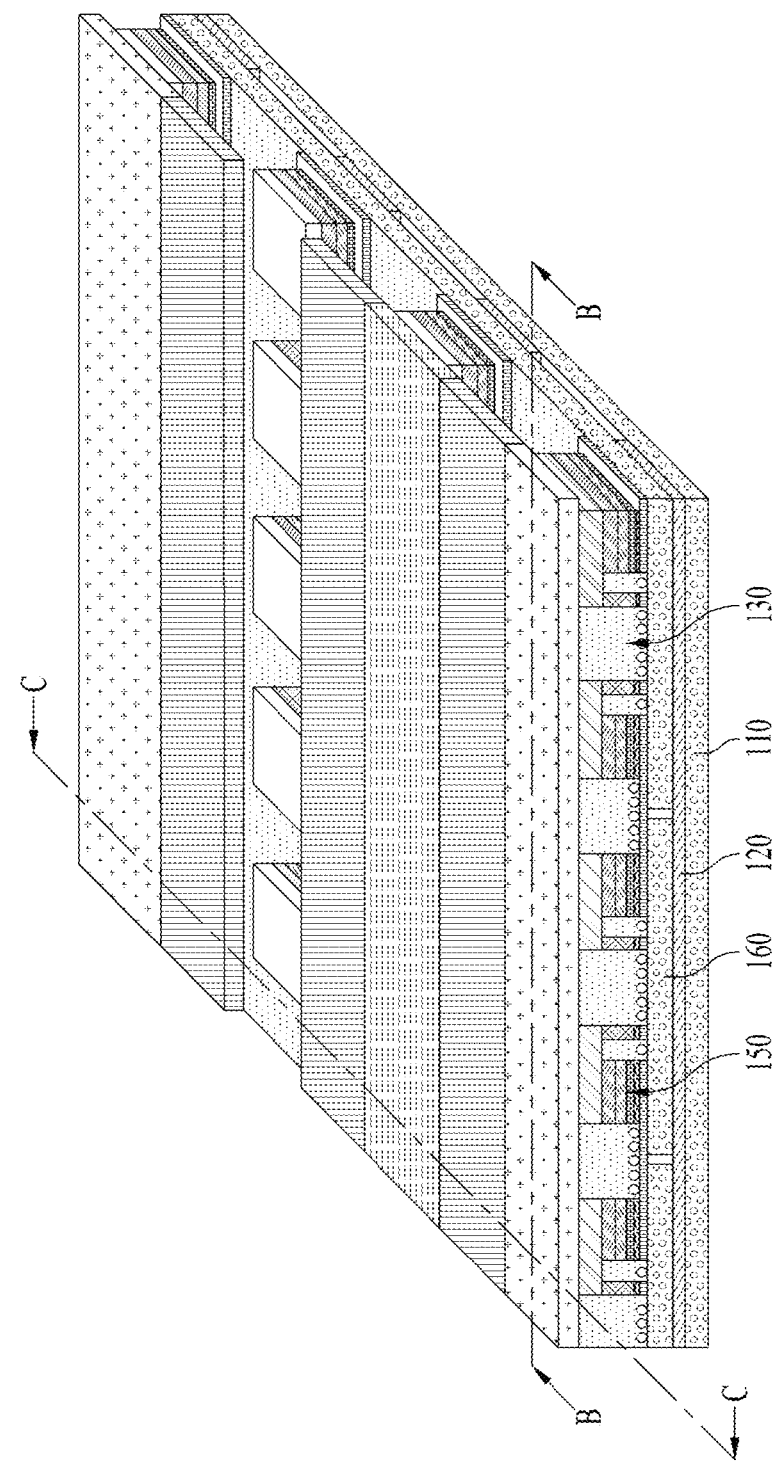
FIG. 2 is a partially enlarged diagram showing a part A shown in FIG. 1.

FIG. 2 is a partially enlarged view showing part A of FIG. 1.

Figure 3A:
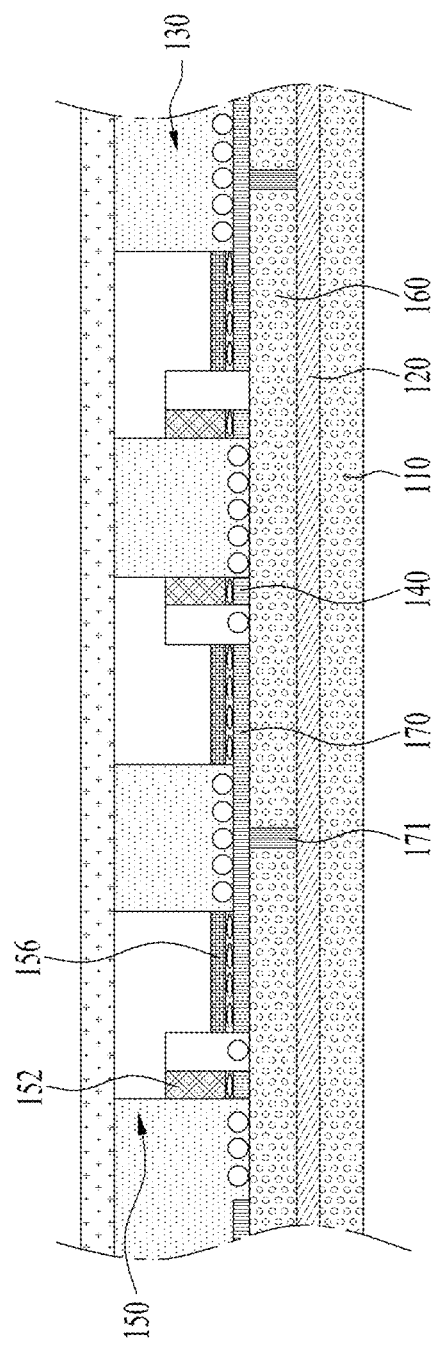
FIGS. 3A and 3B are cross-sectional diagrams taken along the cutting lines B-B and C-C in FIG. 2.
Figure 3B:
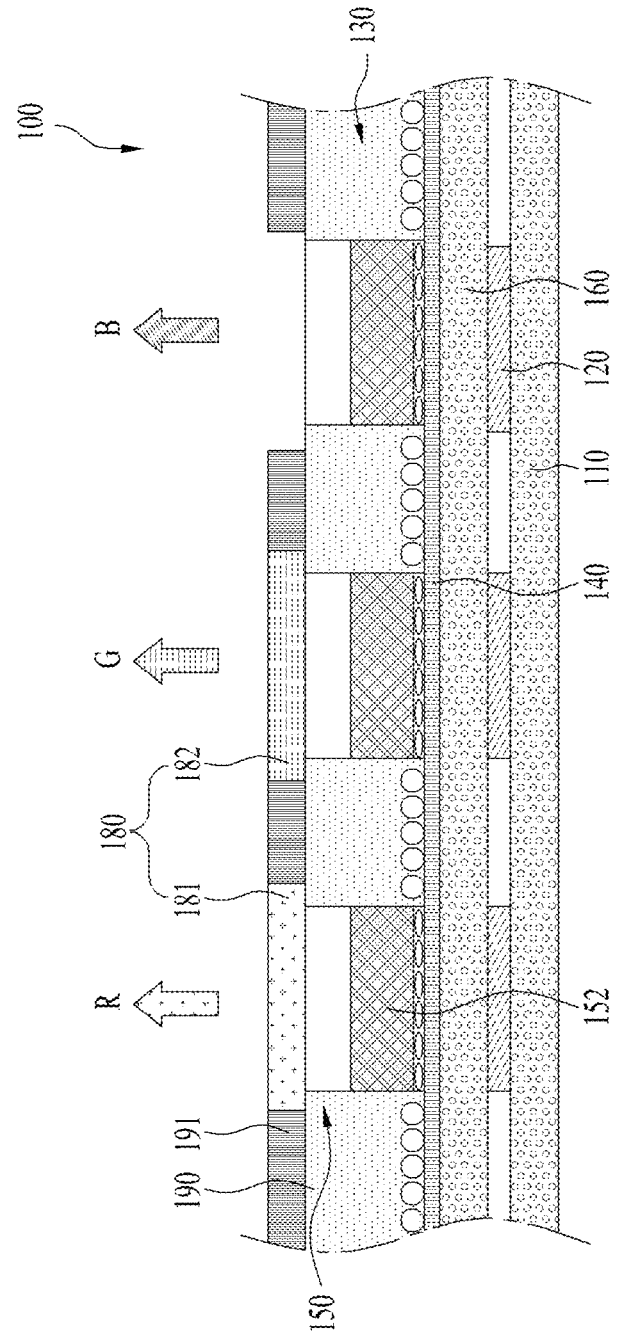

FIGS. 3A and 3B are cross-sectional views taken along lines B-B and C-C in FIG. 2.

Figure 4:
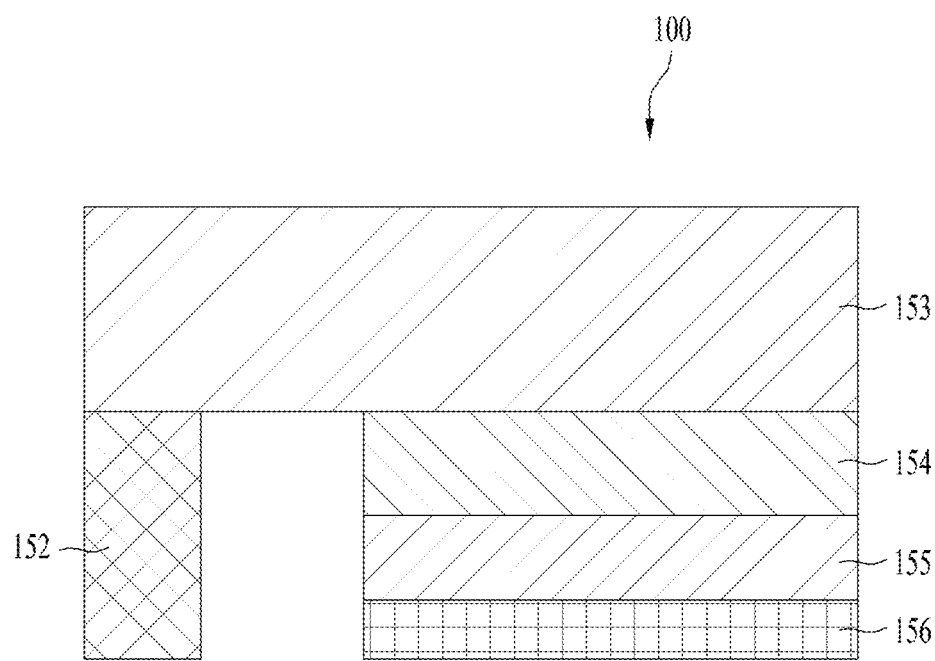
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
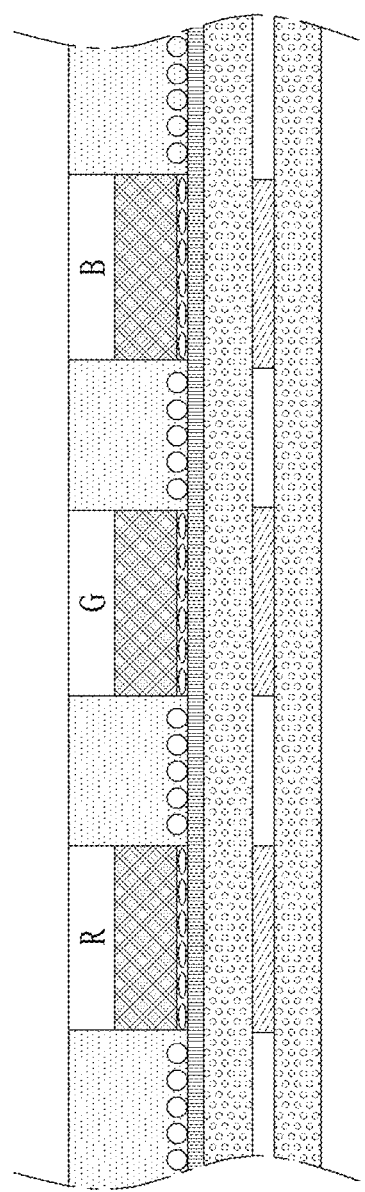
Figure 5B:
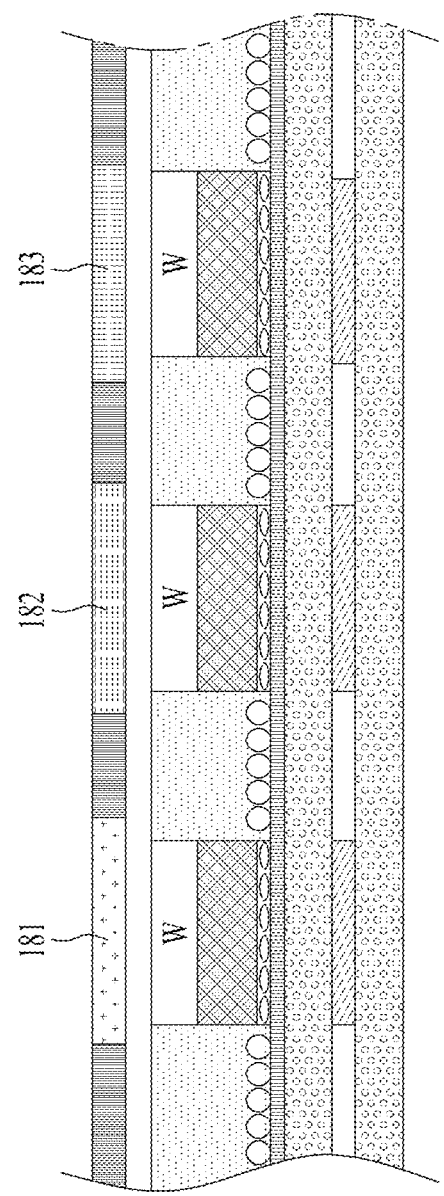

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on an ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 mm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
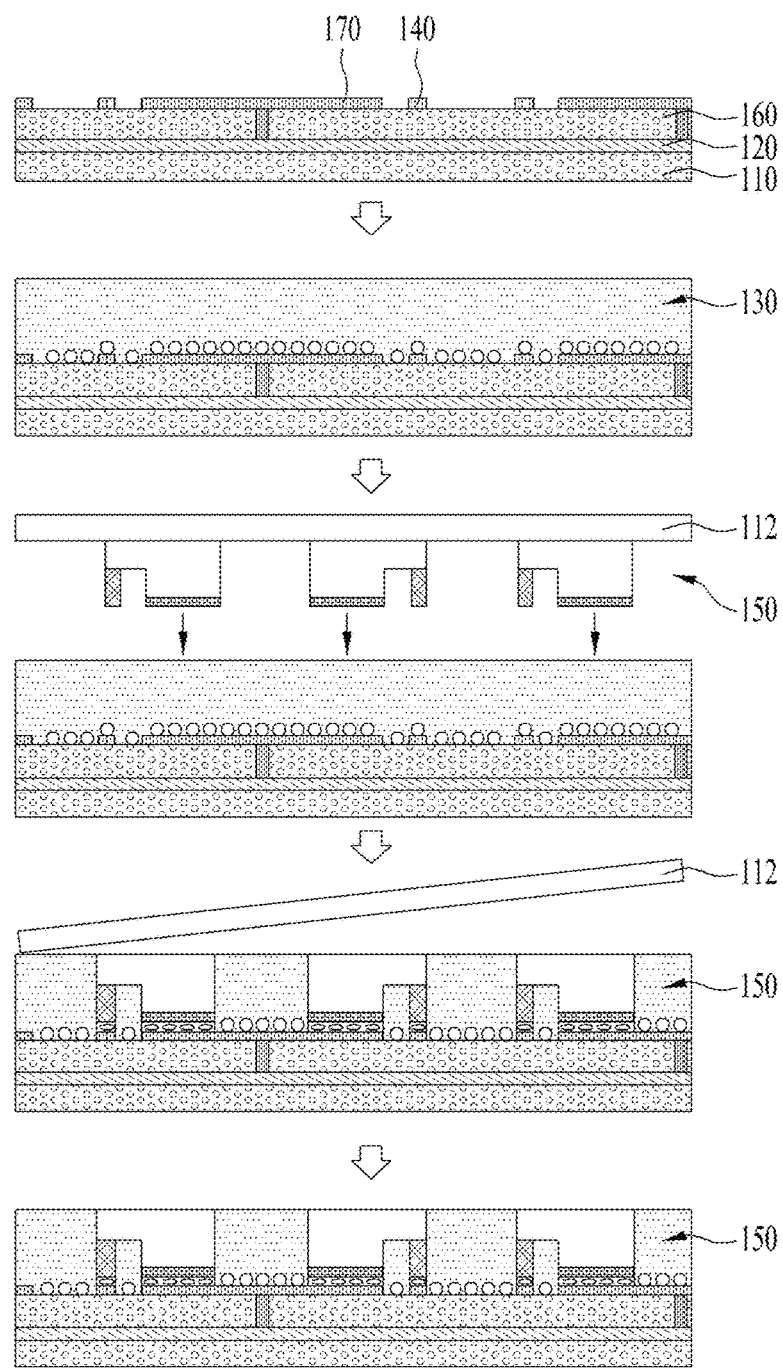
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer.

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
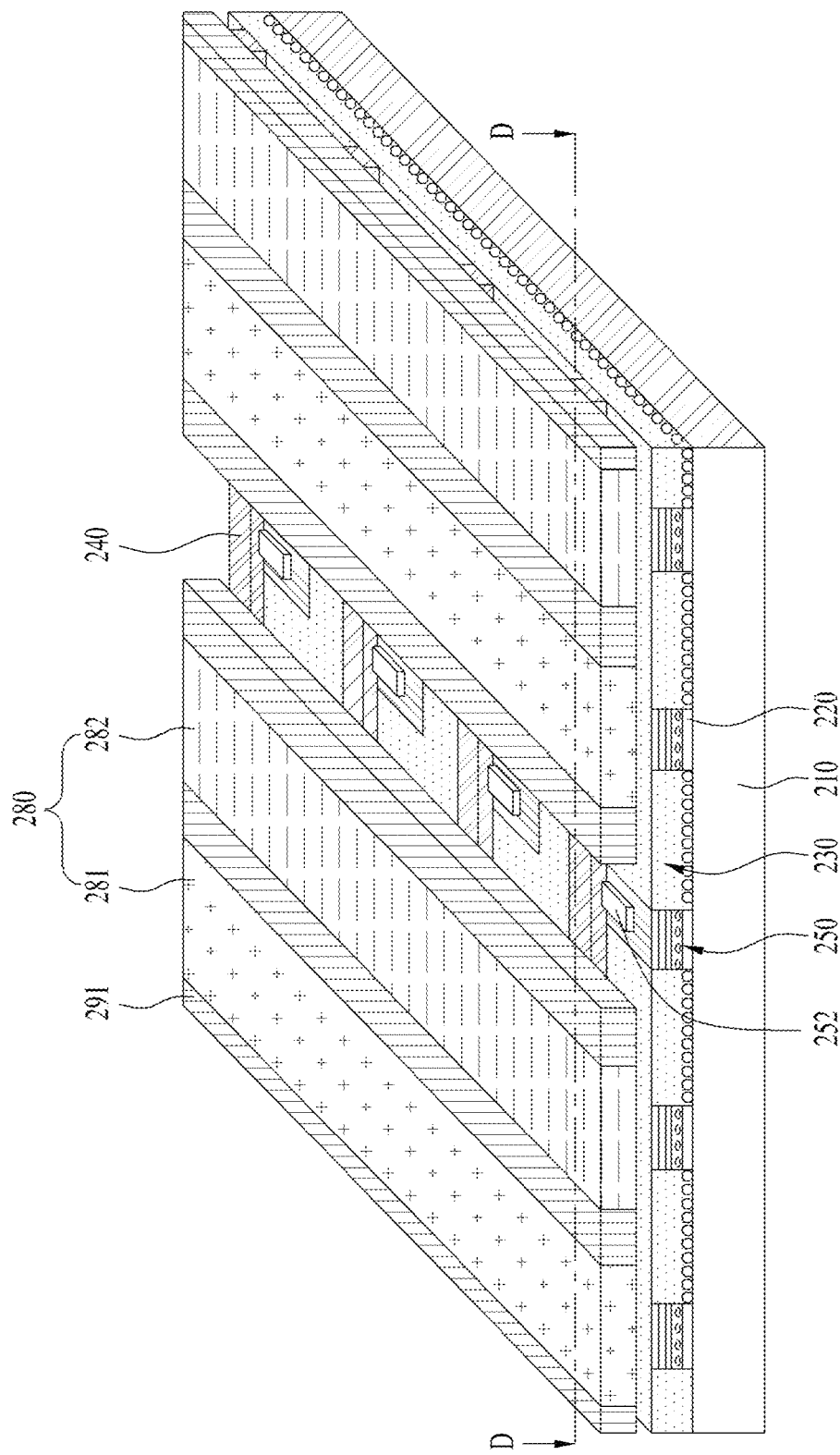
FIG. 7 is a perspective diagram of a display device using a semiconductor light emitting element according to another embodiment of the present disclosure.
Figure 8:
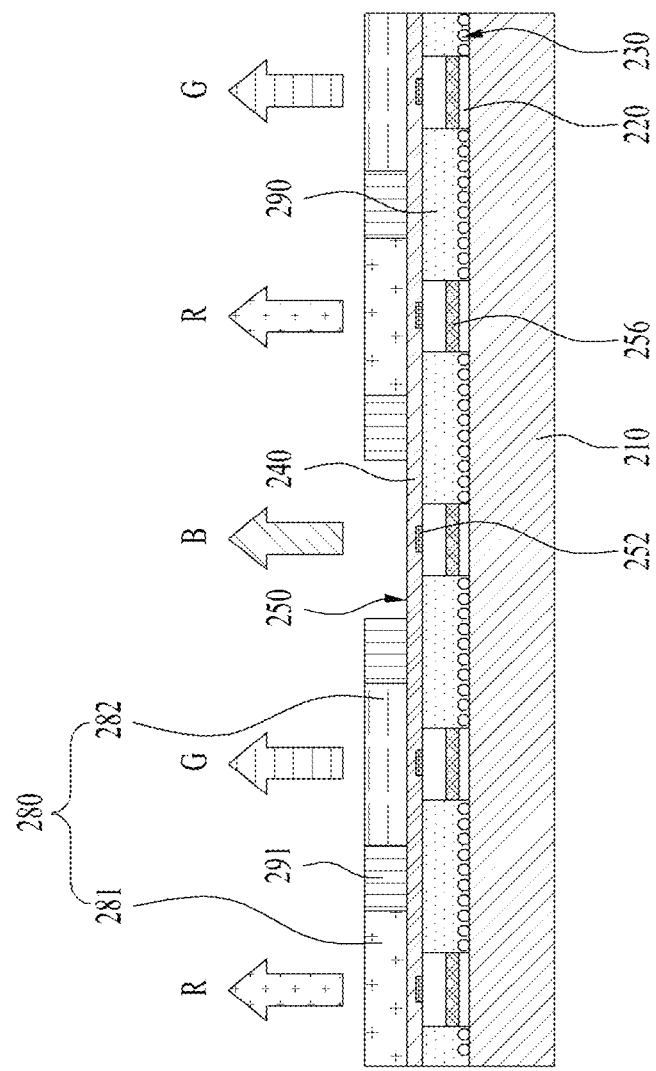
FIG. 8 is a cross-sectional diagram taken along a cutting line D-D shown in FIG. 8.
Figure 9:
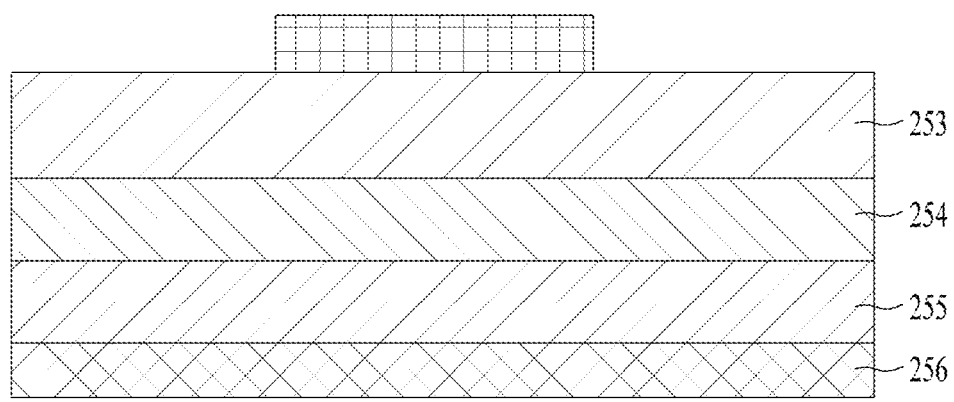
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
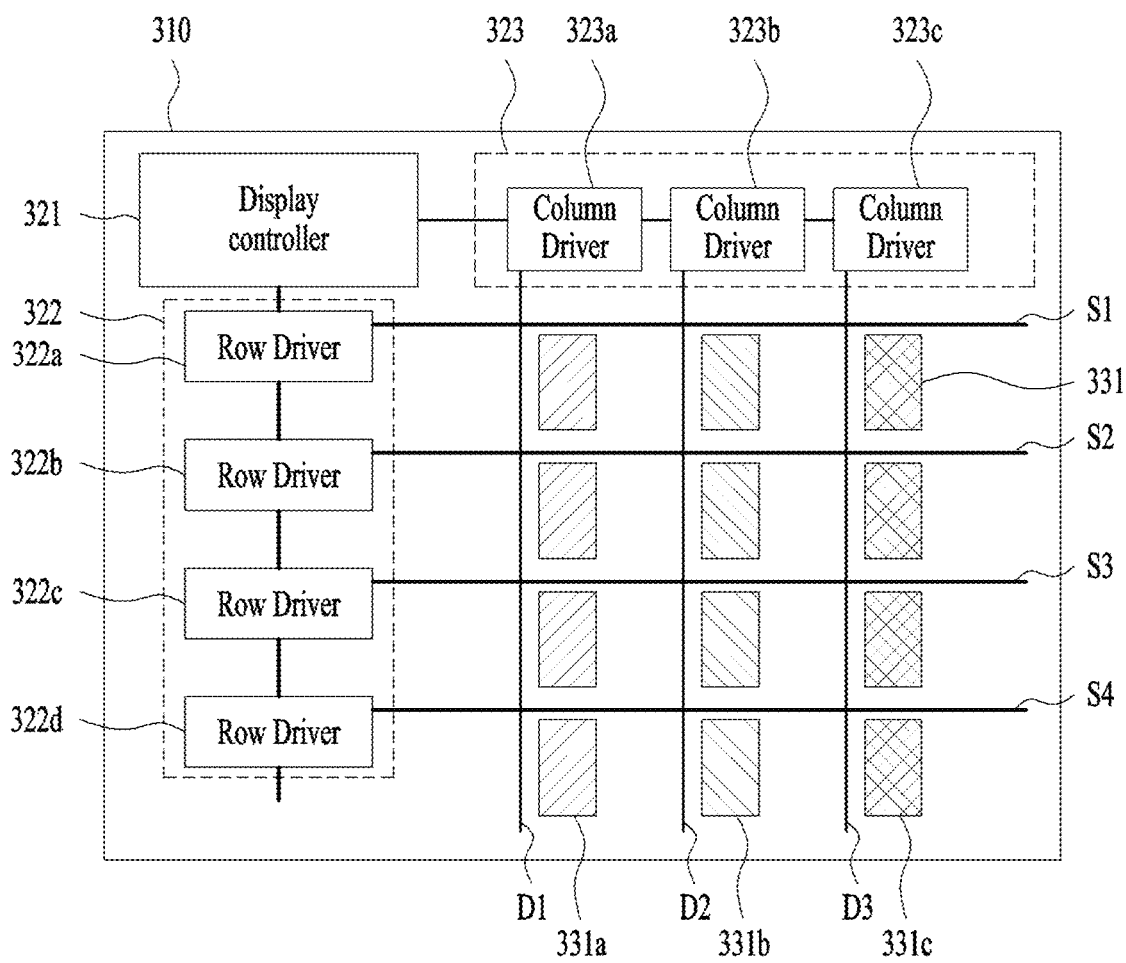
FIG. 10 is a schematic diagram for explaining a basic concept of driving a semiconductor light emitting element.

FIG. 10 is a schematic diagram for explaining a basic concept of driving a semiconductor light emitting element.

According to an embodiment, a display device using a semiconductor light emitting element may include a base substrate 310, a row driver 322 providing a first signal to a semiconductor light emitting element 331, a column driver 323 providing a second signal to the row driver 322 and the column driver 323, and a display controller 321 controlling signals provided to the row driver 322 and the column driver 323.

The base substrate 310 may correspond to the substrate 110 described with reference to FIG. 1. The row driver 322, the column driver, and the display controller 321 may be provided on the base substrate 310. In some cases, at least one of the column driver 323, the row driver, or the controller 321 may be provided on another substrate and connected to a wiring circuit provided on the base substrate 310.

The row driver 322 may be a component providing a scan signal to a row in which the semiconductor light emitting elements 331 are listed. Here, the scan signal may correspond to the first signal. A plurality of rows in which the semiconductor light emitting elements 331 are arranged may be provided on the base substrate 310. In this case, a plurality of row drivers 322a to 322d may be provided according to the number of rows. In some cases, the row driver 322 may be provided with fewer rows than the number of rows in which the semiconductor light emitting elements 331 are listed. In this regard, it will be described in detail in another embodiment.

The row driver 322 may be connected to row lines S1 to S4 extending in a row direction on the base substrate 310. The row driver 322 may provide the same signal to the semiconductor light emitting elements 331 connected along the row lines S1 to S4. For example, the first row driver 322 may be connected to a first row line S1 and may provide the same signal to the plurality of the semiconductor light emitting elements 331 connected along the first row line S1. Here, the plurality of row drivers 322a to 322d may sequentially provide signals to the rows of the semiconductor light emitting element 331.

The column driver 323 may be a component providing a data signal to a column in which the semiconductor light emitting elements 331 are listed. Here, the data signal may correspond to the second signal. A plurality of columns in which the semiconductor light emitting elements 331 are arranged may be provided on the base substrate 310. In this case, the plurality of column drivers 323a to 323c may be provided according to the number of columns. In some cases, the column driver 323 may be provided with fewer columns than the number of columns in which the semiconductor light emitting elements 331 are listed. In this regard, it will be described in detail in another embodiment.

The column driver 323 may be connected to column lines DI to D3 extending in a column direction on the base substrate 310. The column driver 323 may provide the same signal to the semiconductor light emitting elements 331 connected along the column lines DI to D3. For example, the first column driver 323a may be connected to a first column line DI, and may provide the same signal to the plurality of semiconductor light emitting elements 331 connected along the first column line DI. Here, the plurality of column drivers 323a to 323c may simultaneously provide signals to the columns of the semiconductor light emitting element 331.

The display controller 321 may control signals provided from the row driver 322 and the column driver 323. The display controller 321 may receive image data to be implemented through a display, and may control light emission of a matrix in which the semiconductor light emitting elements 331 are arranged during each frame in response to the image data. Here, the matrix in which the semiconductor light emitting elements 331 are arranged may mean a row and column arrangement formed by the plurality of the semiconductor light emitting elements 331.

The display controller 321 may control the first signal provided by the row driver 322 and the second signal provided by the column driver 323 during one frame, may configure a plurality of frames, and may implement the received image data on the matrix on which the semiconductor light emitting elements 331 are arranged.

The semiconductor light emitting element 331 may emit light in response to signals provided by the column driver 323 and the row driver 322. In detail, the semiconductor light emitting element 331 positioned at a point where signals of the column driver 323 and the row driver 322 intersect may emit light in response to a provided signal. For example, when a scan signal is provided from the first column driver 322a and a light emitting signal is provided from the first row driver 323a, the semiconductor light emitting element 331 positioned on a (1,1) matrix may emit light.

The semiconductor light emitting element 331 may include a semiconductor light emitting element 331a emitting blue light, a semiconductor light emitting element 331b emitting red light, and a semiconductor light emitting element 331c emitting green light.

The semiconductor light emitting element 331 may be a micro-LED having a size of tens or several microns. Here, the semiconductor light emitting element 331 may be a flip chip type semiconductor light emitting element described in FIG. 4 or a vertical semiconductor light emitting element described in FIG. 9.

One semiconductor light emitting element set 331 may be connected to one of the row lines S1 to S4 and one of the column line DI to D3 to achieve passive matrix (PM) driving. Here, the PM driving connection may be a connection in which a first electrode and a second electrode of the semiconductor light emitting element 331 directly receive signals transmitted through one column driver and one row driver, respectively. Here, the first electrode may be a p-electrode, and the second electrode may be an n-type electrode. Alternatively, the first electrode may be an n-type electrode and the second electrode may be a p-type electrode.

As seen from the embodiment of FIG. 10, a plurality of rows formed by the plurality of row drivers 322a to 322d and the semiconductor light emitting elements 331 may be matched one-to-one. In addition, it can be seen that a plurality of columns formed by a plurality of column drivers 323a to 323c and the semiconductor light emitting elements 331 are matched one-to-one. Hereinafter, a circuit configuration for reducing the number of drivers will be described.

According to an embodiment, a display device using a semiconductor light emitting element may include the base substrate 310, the row driver 322 providing a first signal to the semiconductor light emitting element 331, the column driver 323 providing a second signal to the semiconductor light emitting element 331, and the plurality of semiconductor light emitting elements 331 provided on the column driver 323 and the base substrate. In addition, the display device using a semiconductor light emitting element may include the display controller 321.

The row driver 322 may provide a 3-state first signal including high, ground, and low. Here, high may mean a signal with a higher potential than the ground, and low may mean a signal with a lower potential than the ground. Here, the ground signal means a reference signal and may be independent of the ground potential.

The column driver 323 may provide a 2-state second signal including high and low. Here, high may mean a signal with a higher potential than low. The high signal of the second signal may not be necessarily the same potential signal as the high signal of the first signal. Similarly, the low signal of the second signal may not be necessarily the same potential signal as the low signal of the first signal.

The row driver 322 may provide a high signal in a first ½ frame and a low signal in a next ½ frame, or provide signals in a reverse order.

In this case, the signal provided by the row driver 322 may be more discriminated and a stable signal may be provided.

In some cases, the semiconductor light emitting element 331 may be connected to one of the row lines S1 to S4 and one of the column lines DI to D3 to achieve active matrix (AM) driving. Here, the AM driving connection may be a connection structure for emitting light from the semiconductor light emitting element 331 using a thin film transistor (TFT) and a storage capacitor. In detail, in the AM driving connection, when a first TFT is converted into an on-state by a gate signal provided from the row driver 322, and a data signal provided from the column driver 323 passes through the first TFT, the second TFT may be converted into an on-state to store a voltage between a fixed high potential and the second TFT in a storage capacitor and to emit light from the semiconductor light emitting element 331 using a voltage difference between the stored potential and a fixed ground potential. The AM driving connection has an advantage of minimizing cross talk occurring in PM driving by storing data signals for one frame, but has a disadvantage in that the circuit is complicated.

When the semiconductor light emitting element 331 is directly connected on the base substrate 310, all circuit configurations for driving the semiconductor light emitting element 331 need to be completed on the base substrate, which may have a disadvantage in that it is difficult to respond to various display products. In addition, since inspection needs to be performed at an entire level, there is a problem in that a product yield is lowered.

In order to overcome this problem, a manufacture method of placing the semiconductor light emitting element 331 on the unit-module interposer 330 (refer to FIG. 11) and then transferring the unit-module interposer 330 of an intermediate unit module on the base substrate rather than being directly connected to the base substrate 310 may be considered. Hereinafter, the structure of the unit-module interposer 330 will be described in detail.

Figure 11:
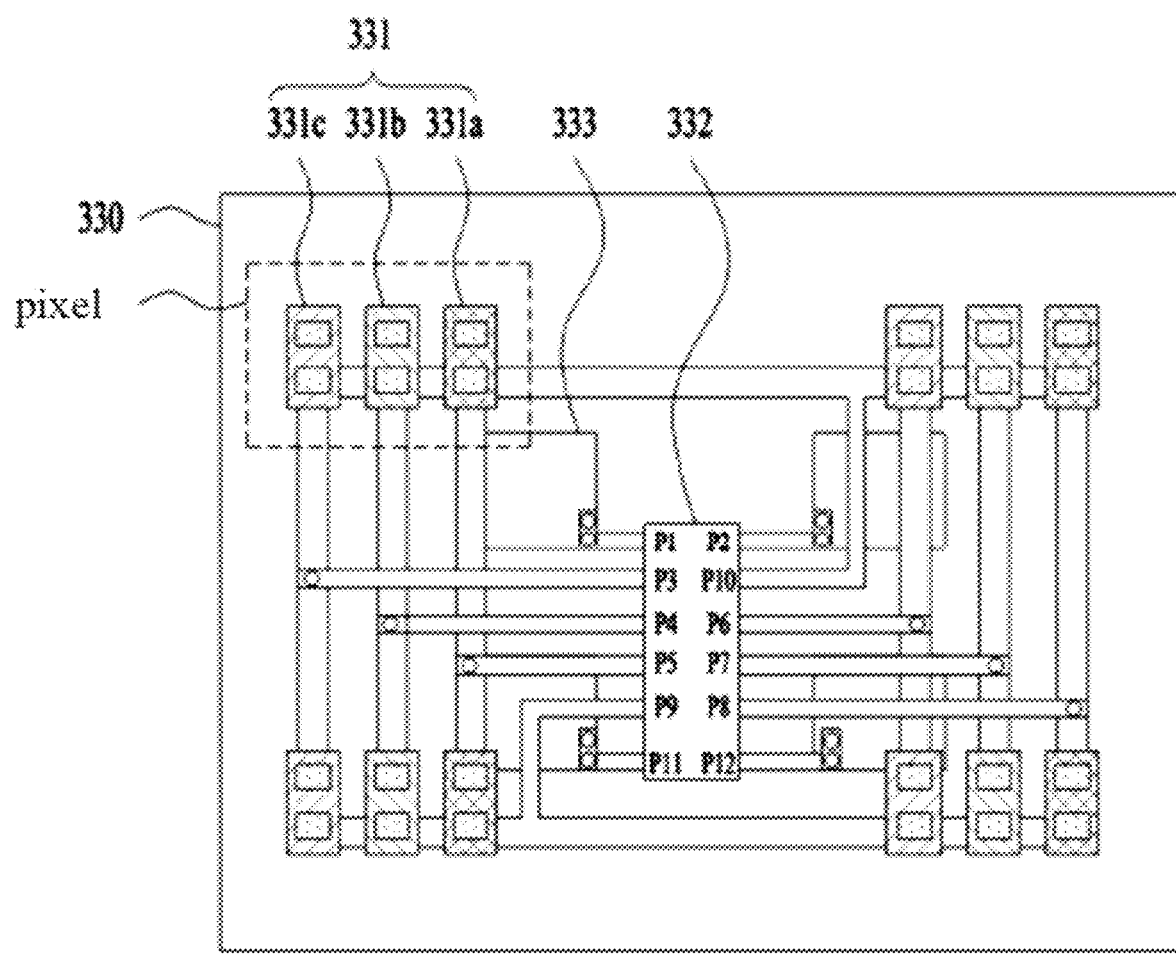
FIG. 11 is a conceptual diagram of a unit-module interposer according to an embodiment.

FIG. 11 is a conceptual diagram of the unit-module interposer 330 according to an embodiment. Hereinafter, for the same configuration, the description of FIG. 10 may be referred to.

According to an embodiment, a display device using a semiconductor light emitting element may include the base substrate 310, the row driver 322 providing a first signal to the semiconductor light emitting element 331, and the column driver 323 providing a second signal to the semiconductor light emitting element 331.

The display device using the semiconductor light emitting element may further include the interposer 330 provided on the base substrate and having the semiconductor light emitting element 331 and the IC chip 332 as a basic component.

The interposers 330 may be transferred and arranged in unit modules including a semiconductor light emitting element set corresponding to a pixel and may be used to configure a large screen display. Here, the semiconductor light emitting element set may include the blue light semiconductor light emitting element 331a, the red light semiconductor light emitting element 331b, and the green light semiconductor light emitting element 331c. In some cases, the interposer 330 may include a plurality of semiconductor light emitting elements and may be coupled to the base substrate 310 to correspond to a plurality of pixel areas.

The IC chip 332 may include a pin P1 connected to a row driver, a pin P2 connected to a column driver, pins P3, P4, P5, P6, P7, and P8 connected to the first electrode of the semiconductor light emitting element 331 to provide a data signal, and pins P9 and P10 connected to the second electrode of the semiconductor light emitting element 331 to provide a reference signal. In addition, in the case of AM driving, the IC chip may include a pin P11 connected to a fixed high potential and a pin P12 connected to a fixed ground potential.

In the case of AM driving, the IC chip 332 may further include a thin film transistor (TFT) and a storage capacitor. The storage capacitor is one embodiment of the storage configuration and may be replaced with a configuration such as a flip flop digital latch. In this case, the IC chip may divide and provide the second signal provided through the column driver 323 to the blue light semiconductor light emitting element 331a, the red light semiconductor light emitting element 331b, and the green light semiconductor light emitting element 331c. Alternatively, the second signal may be divided and provided for each pixel.

Figure 12:
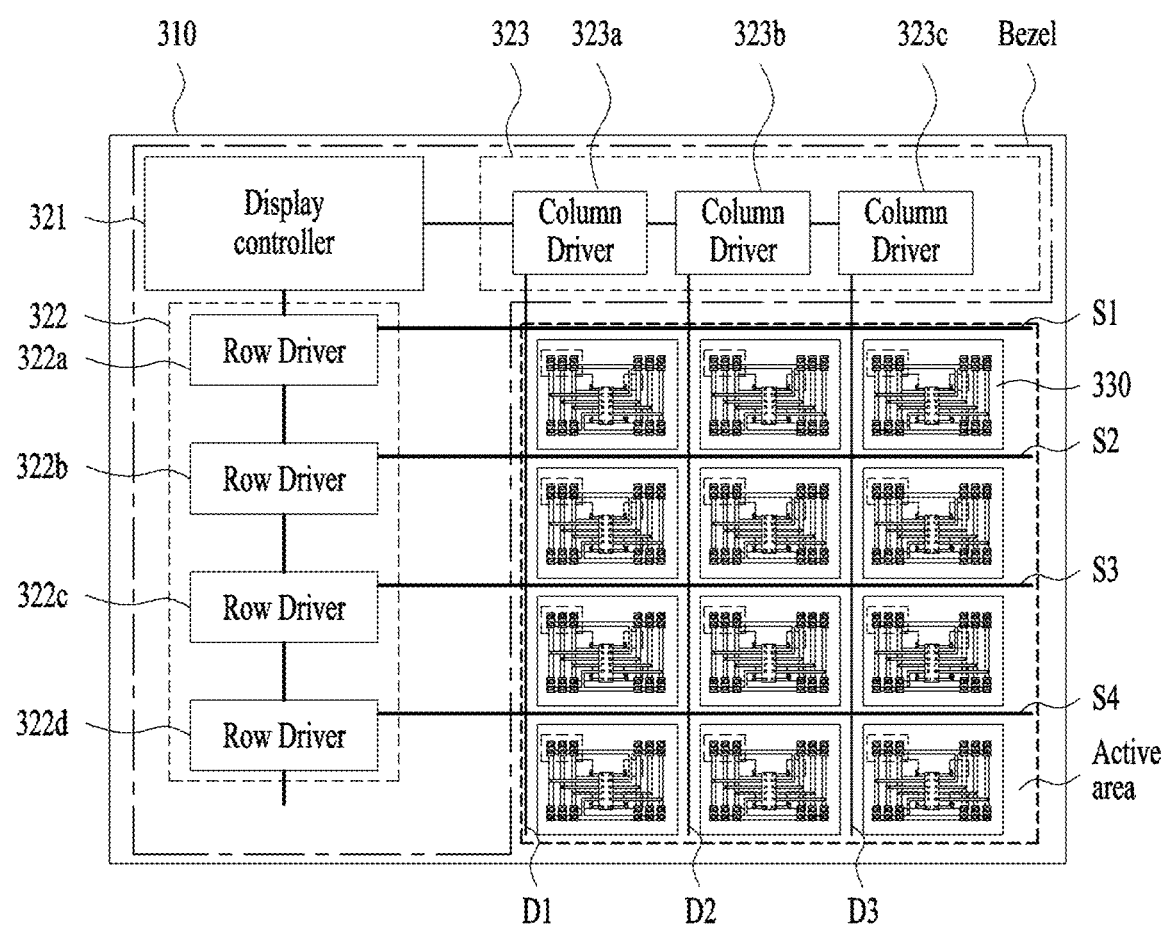
FIG. 12 is a conceptual diagram for explaining the state in which an interposer of FIG. 11 is provided on a base substrate.

FIG. 12 is a conceptual diagram for explaining the state in which the interposer 330 of FIG. 11 is provided on the base substrate 310. For the same configuration, the description of FIGS. 10 and 11 may be referred to.

According to an embodiment, a display device using a semiconductor light emitting element may include the base substrate 310, the row driver 322 providing a first signal to the semiconductor light emitting element 331, and the column driver 323 providing a second signal to the semiconductor light emitting element 331.

In addition, the display device using a semiconductor light emitting element may include the display controller 321 controlling signals provided to the column driver 323 and the row driver 322. In some cases, the display controller 321 may not be provided on the base substrate 310 but may be provided on a separate substrate.

The display device using a semiconductor light emitting element may further include the interposer 330 provided on the base substrate 310 and having the semiconductor light emitting element 331 and the IC chip 332 as a basic component.

The unit-module interposer 330 may be provided on the base substrate 310 according to an active area. Here, the active area may be an area in which an image signal is output.

The base substrate 310 may include a bezel along an edge of the active area. Here, the bezel may be an area to which an image signal is not output, and may include at least one of the display controller 321, the row driver 322, or the column driver 323. Conversely, a display device using a semiconductor may require a bezel area to include at least one of the display controller 321, the row driver 322, or the column driver 323, and the bezel area may act as a factor that hinders user concentration on an image.

Hereinafter, an embodiment in which a bezel area is minimized using an interposer that further includes at least one of the row driver 322 or the column driver 323 will be described.

Figure 13:
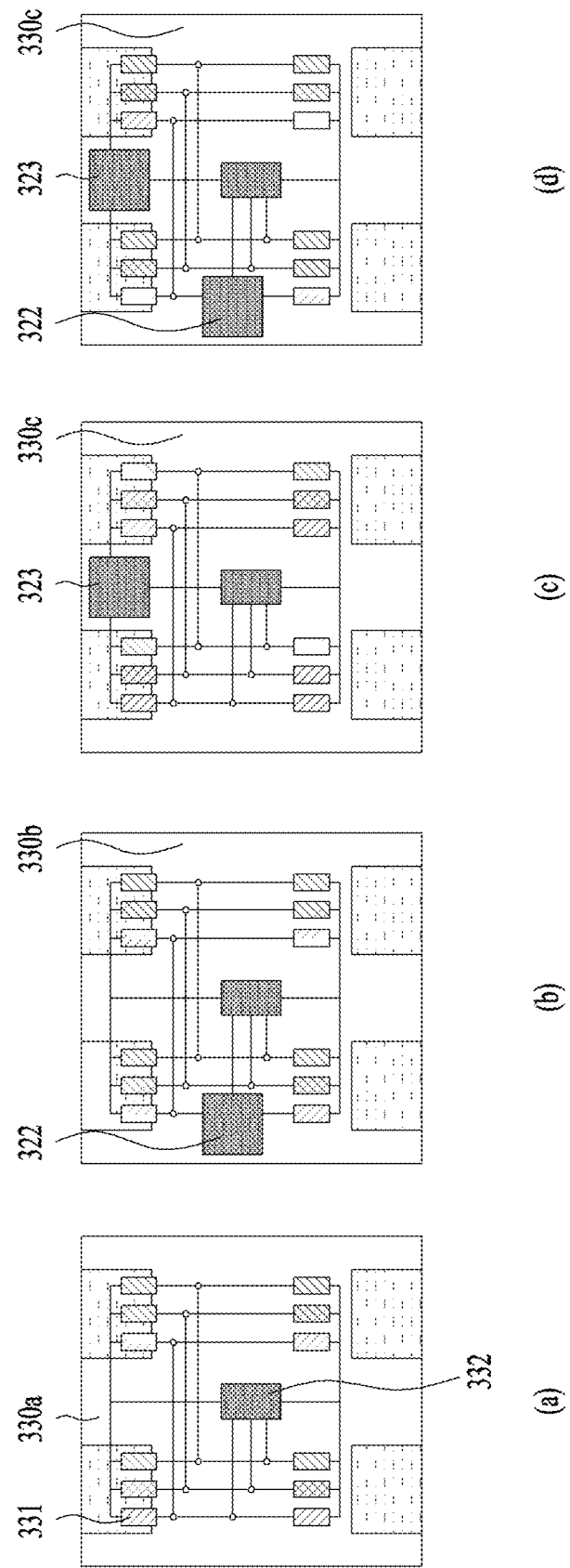
FIG. 13 is a conceptual diagram of a first interposer having a basic configuration and a second interposer including at least one of a row driver and a column driver in addition to the basic configuration.

FIG. 13 is a conceptual diagram of a first interposer having a basic configuration and a second interposer including at least one of a row driver and a column driver in addition to the basic configuration. Specifically, FIG. 13(a) shows a first interposer, FIG. 13(b) shows a second interposer including a row driver in addition to the basic configuration, and FIG. 13(c) shows a column driver in addition to the basic configuration, and FIG. 13(d) shows a second interposer further including a row driver and a column driver in addition to the basic configuration. For the same configuration, the description of FIGS. 10 and 11 may be referred to.

According to an embodiment, a display device using a semiconductor light emitting element may include the base substrate 310, the row driver 322 providing a first signal to the semiconductor light emitting element 331, and the column driver 323 providing a second signal to the semiconductor light emitting element 331.

The display device using the semiconductor light emitting element according to an embodiment may include a first interposer 330a provided on the base substrate 310 and having the semiconductor light emitting element 331 and the IC chip 332 as a basic component. Here, the first interposer 330a may correspond to the interposer 330 described with reference to FIG. 11.

The display device using the semiconductor light emitting element according to an embodiment may include second interposers 330b, 330c, and 330d that further include at least one of the row driver 322 or the column driver 323 in addition to the basic configuration.

The semiconductor light emitting element according to an embodiment may include the second interposers 330b, 330c, and 330d in the active area, and a bezel area for including at least one of the row driver 322 or the column driver 323 may be omitted.

Hereinafter, an embodiment in which the first interposer 330a and the second interposers 330b, 330c, and 330d are provided on the base substrate 310 will be described.

Figure 14:
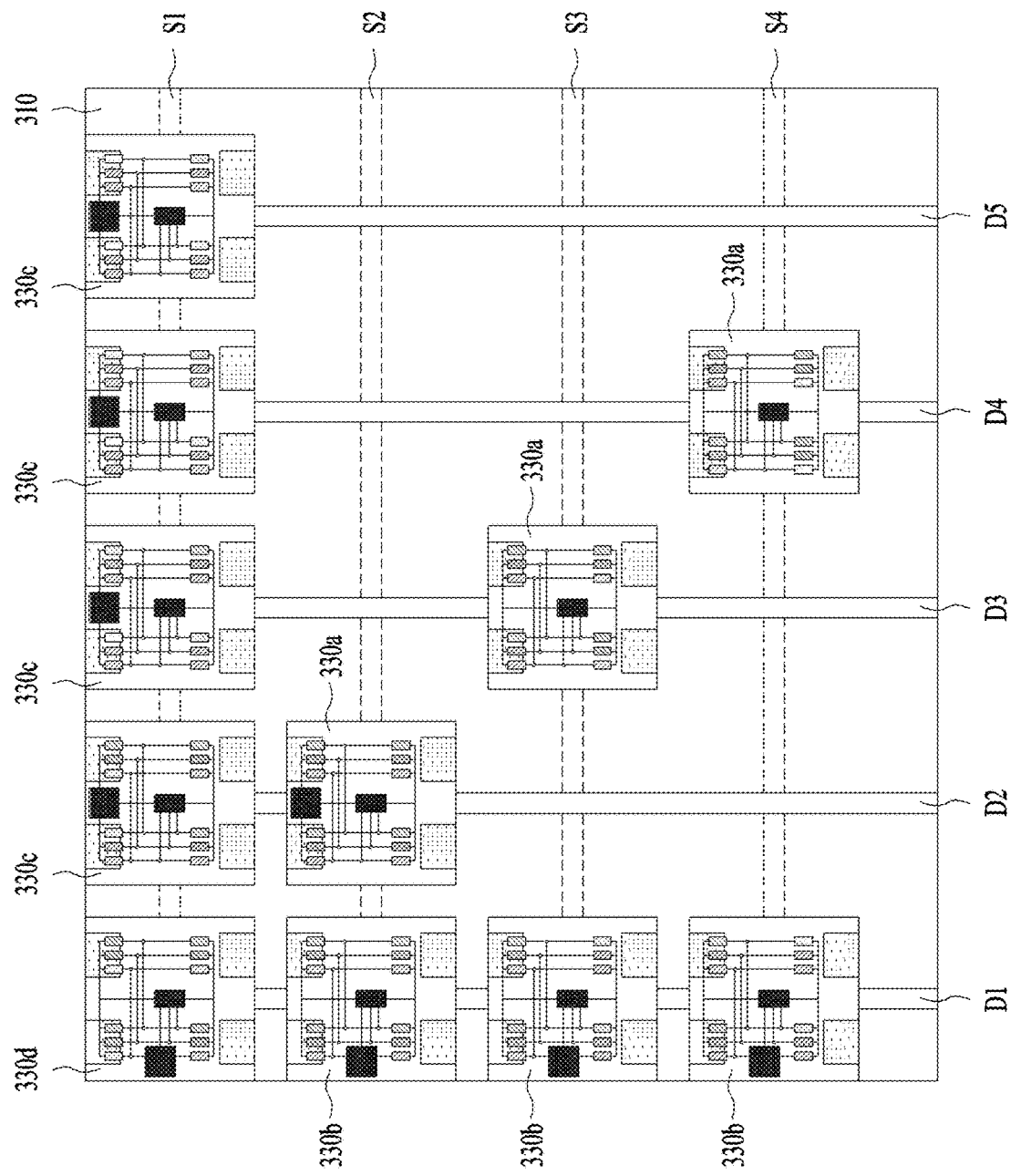
FIG. 14 is a conceptual diagram in which a first interposer and second interposers are provided on a base substrate according to an embodiment.

FIG. 14 is a conceptual diagram in which the first interposer 330a and the second interposers 330b, 330c, and 330d are provided on the base substrate 310 according to an embodiment. For the same configuration, the description of FIGS. 10 and 13 may be referred to.

According to another embodiment, a display device using a semiconductor light emitting element may include the base substrate 310, the row driver 322 providing a first signal to the semiconductor light emitting element 331, the column driver 323 providing a second signal to the semiconductor light emitting element 331.

The display device using the semiconductor light emitting element according to an embodiment may further include the first interposer 330a provided on the base substrate 310 and having the semiconductor light emitting element 331 and the IC chip 332 as a basic component. Here, the first interposer 330a may correspond to the interposer 330 described with reference to FIG. 11.

The display device using the semiconductor light emitting element according to an embodiment may include the second interposers 330b, 330c, and 330d further including at least one of the row driver 322 or the column driver 323 in addition to the basic configuration.

The first interposer 330a may be provided inside a specific area of the base substrate 310, and the second interposers 330b, 330c, and 330d may be provided at an edge of the specific area. Here, the specific area may be one area or the entire area of the base substrate 310. FIG. 14 shows an embodiment in which a specific area corresponds to the entire area of the base substrate 310.

The second interposer 330b further including the row driver may be provided along a column-direction edge in the specific area. The second interposer 330b further including the row driver may serve to provide a first signal to the first interposer 330a provided in a row direction in the specific area and the second interposer 330b further including the row driver. For example, the second interposer 330b further including a row driver provided in a second row may provide a first signal to the first interposer 330a provided in the second row and the second interposer 330b further including the row driver. The second interposer 330c further including the column driver may be provided along a row-direction edge in the specific area. The second interposer 330b further including the column driver may serve to provide a second signal to the first interposer 330a provided in a column direction in the specific area and the second interposer 330c further including the column driver. For example, the second interposer 330c further including the column driver provided in a second column may provide a second signal to the first interposer 330a provided in the second column and the second interposer 330c further including the column driver.

The second interposer 330d further including the row driver and the column driver may be provided at a vertex in the specific area. The second interposer 330d further including the row driver and the column driver may server to provide a first signal to the first interposer 330a provided in a row direction in the specific area and the second interposer 330d further including the row driver and the column driver. Simultaneously, the second interposer 330d further including the row driver and the column driver may server to provide a second signal to the first interposer 330a provided in a column direction in the specific area and the second interposer 330d further including the row driver and the column driver. The second interposer 330d further including the row driver and the column driver may provide the first signal and the second signal in the first row and the first column in the specific area.

In detail, the row driver 322 included in the second interposers 330b, 330c, and 330d may provide the same first signal to the IC chips 332 listed in the row direction in the specific area. Similarly, the column driver 323 included in the second interposers 330b, 330c, and 330d may provide the same second signal to the IC chips 332 listed in the column direction in the specific area.

FIG. 14 shows an embodiment in which an entire area of the base substrate 310 is one specific area. However, depending on the shape of a display, the specific area may be subdivided in various ways. Hereinafter, an embodiment in which a specific area is divided on the base substrate 310 and includes the first interposer 330a and the second interposers 330b, 330c, and 330d will be described.

Figure 15:
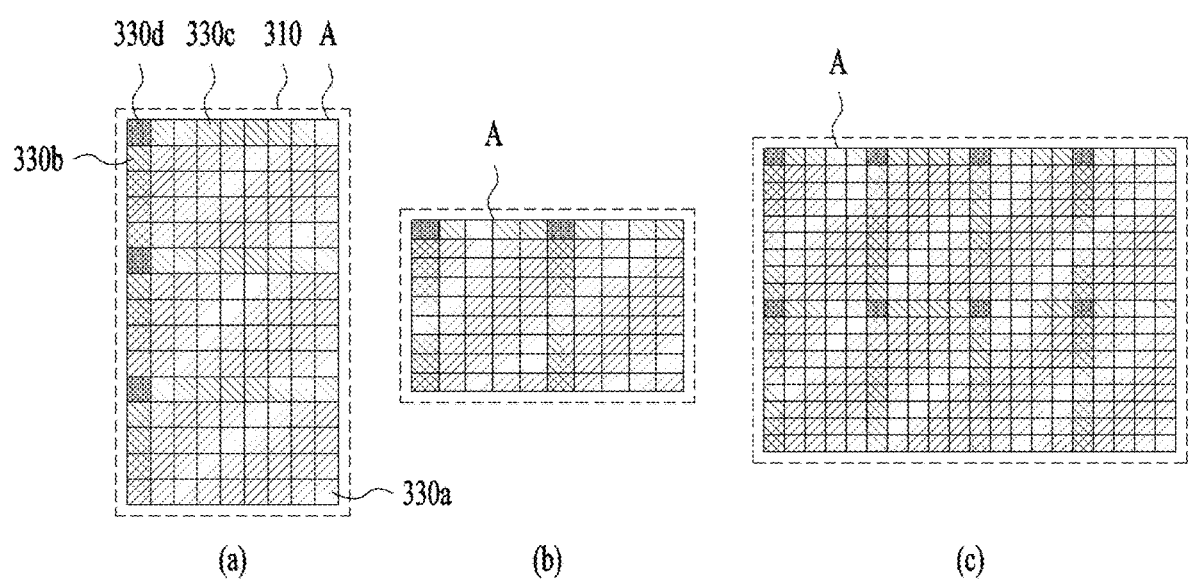
FIG. 15 illustrates an embodiment in which a base substrate is divided into a plurality of specific areas.

FIG. 15 illustrates an embodiment in which the base substrate 310 is divided into a plurality of specific areas. In detail, FIG. 15(a) shows an embodiment in which the base substrate 310 is divided into a plurality of specific areas in a column direction, and FIG. 15(b) shows an embodiment in which the base substrate 310 is divided into a plurality of specific areas in a row direction, and FIG. 15(c) shows an embodiment in which the base substrate 310 is divided in a column direction and a row direction. Hereinafter, for the same configuration, the description of FIG. 14 may be referred to.

According to another embodiment, a display device using a semiconductor light emitting element may include the base substrate 310, the row driver 322 providing a first signal to the semiconductor light emitting element 331, the column driver 323 providing a second signal to the semiconductor light emitting element 331.

The display device using the semiconductor light emitting element according to an embodiment may further include the first interposer 330a provided on the base substrate 310 and having the semiconductor light emitting element 331 and the IC chip 332 as a basic component. Here, the first interposer 330a may correspond to the interposer 330 described with reference to FIG. 11.

The display device using the semiconductor light emitting element according to an embodiment may include the second interposers 330b, 330c, and 330d further including at least one of the row driver 322 or the column driver 323 in addition to the basic configuration.

The first interposer 330a may be provided inside a specific area A of the base substrate 310, and the second interposers 330b, 330c, and 330d may be provided at an edge of the specific area A. The plurality of specific areas A may be provided on the base substrate 310.

According to an embodiment, when the number of rows formed by the semiconductor light emitting elements 331 is greater than or equal to a predetermined number, the base substrate 310 may include a plurality of specific areas A in the column direction. FIG. 15(a) shows an embodiment in which the base substrate 310 is divided in a column direction and includes three specific areas A.

When a display using a semiconductor is long in a column direction, it may take a lot of time to scan in the column direction during one frame. This may cause a problem that a time of one frame becomes long. Therefore, when the base substrate 310 is divided in the column direction and simultaneously and sequentially scanned in each specific area A, a time required for one frame may be reduced. For example, in the case of FIG. 15(a), the base substrate may be divided into three specific areas A in the column direction, and each specific area A may be scanned simultaneously and sequentially, and thus the time required for one frame may be reduced by ⅓ compared with the case in which the area is not divided.

According to another embodiment, when the number of columns formed by the semiconductor light emitting elements 331 is greater than or equal to a predetermined number, the base substrate 310 may include a plurality of specific areas A in the row direction. FIG. 15(b) shows an embodiment in which the base substrate 310 is divided in a row direction and includes two specific areas A.

When a display using a semiconductor is long in a row direction, the reliability of the second signal provided at an end in a row direction may be degraded. This is because the signal provided to the column driver farther from the display controller 321 in the row direction increases a voltage drop generated in a lead wire or a branch circuit. Accordingly, when the base substrate 310 is divided in the row direction and signals are directly supplied to each specific area A, voltage drop in a lead wire or a branch circuit may be reduced. For example, in the case of FIG. 15(b), the base substrate 310 may be divided into two specific areas A in the row direction, and the display controller may divide a wire that provides signals to each specific area A to both sides to reduce the length of the wire to pass through one specific area A and reach the other specific area A and to reduce the voltage drop of the signal provided to the column driver 323 by reducing the branch circuit.

When a display using a semiconductor is enlarged, a plurality of specific areas A may be formed by dividing an area occupied by the base substrate 310 in the column direction and at the same time in the row direction as shown in FIG. 15(c).

FIG. 15 shows an embodiment in which the second interposer 330b including a row driver is provided only at one edge (hereinafter referred to as a first edge) in each specific area A and is provided only at one edge connected to the first edge including a column driver. In some cases, the second interposers 330b may be symmetrically provided at both edges.

Figure 16:
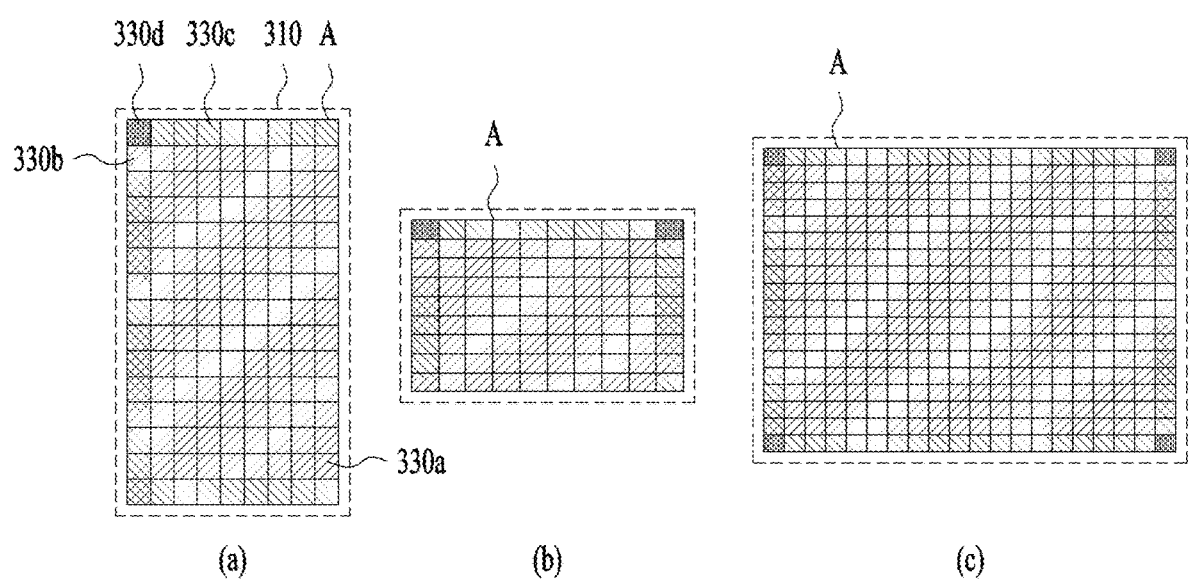
FIG. 16 is a conceptual diagram in which a first interposer and a second interposer are provided in a specific area according to another embodiment.

FIG. 16 is a conceptual diagram in which a first interposer and a second interposer are provided in a specific area according to another embodiment. Hereinafter, for the same configuration, the description of FIGS. 14 and 15 may be referred to.

According to an embodiment, a display device using a semiconductor light emitting element may include the base substrate 310, the row driver 322 providing a first signal to the semiconductor light emitting element 331, and the column driver 323 providing a second signal to the semiconductor light emitting element 331.

The display device using the semiconductor light emitting element according to an embodiment may include the first interposer 330a provided on the base substrate 310 and having the semiconductor light emitting element 331 and the IC chip 332 as a basic component. Here, the first interposer 330a may correspond to the interposer 330 described with reference to FIG. 11.

The display device using the semiconductor light emitting element according to an embodiment may include the second interposers 330b, 330c, and 330d that further include at least one of the row driver 322 or the column driver 323 in addition to the basic configuration.

The first interposer 330a may be provided in the specific area A of the base substrate 310, and the second interposers 330b, 330c, and 330d may be provided at an edge of the specific area A. The plurality of specific areas A may be provided on the base substrate 310.

Referring to FIG. 16(a), the first interposer 330a may be provided within the specific area A of the base substrate 310, the second interposer 330b including the row driver may be provided at one edge (hereinafter referred to as a first edge), and the second interposer 330c including the column driver may be provided at both edges connected to the first edge. In this case, the second interposer 330d including the row driver and the column driver may be provided at both vertices connected to the first edge.

In the embodiment of FIG. 16(a), the column drivers positioned at both edges may provide a second signal in an inward direction of the specific area A. In the embodiment of FIG. 16(a), the effect of the embodiment shown in FIG. 15(a) may be expected without dividing the specific area A into two in the column direction.

Referring to FIG. 16(b), the first interposer 330a may be provided in the specific area A of the base substrate 310, the second interposer 330b including the row driver may be provided at both edges in the row direction, and the second interposer 330b including the column driver may be provided at one edge (hereinafter referred to as a second edge) in the column direction. In this case, the second interposer 330d including the row driver and the column driver may be provided at both vertices of the second edge.

In the embodiment of FIG. 16(b), the second interposer 330b including the row driver positioned at both edges in the row direction may provide a first signal in an inward direction of the specific area A. In the embodiment of FIG. 16(b), the effect of the embodiment shown in FIG. 15(b) may be expected without dividing the specific area A into two in the row direction.

Referring to FIG. 16(c), the first interposer 330a may be provided in the specific area A of the base substrate 310, the second interposer 330b including the row driver may be provided at both edges in the row direction, and the second interposer 330b including the column driver may be provided at one edge in the column direction. In this case, the second interposer 330d including the row driver and the column driver may be provided at all vertices.

In the embodiment of FIG. 16(c), the second interposer 330b including the row driver positioned both edges in the row direction may provide a first signal in an inward direction of the specific area A. Similarly, the second interposer 330c including the column driver positioned at both edges in the column direction may provide the second signal in an inward direction of the specific area A. The second interposer 330d including the row driver and the column driver may provide the first signal and the second signal to the second interposers 330b and 330c positioned at edges. In the embodiment of FIG. 16(c), the effect of the embodiment shown in FIG. 15(c) may be expected without dividing the specific area A into four.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

The invention claimed is:

1. A display device using a semiconductor light emitting element, the display device comprising:
    a base substrate;
    a first interposer provided on the base substrate and including a semiconductor light emitting element and an integrated circuit (IC) chip as a basic component; and
    a second interposer further including at least one of a row driver and a column driver in addition to the basic component,
    wherein the at least one of the row driver and the column driver of the second interposer is directly connected to a pin of the IC chip of the first interposer via a wire of the second interposer.

2. The display device of claim 1, wherein the first interposer is provided within a specific area of the base substrate, and
    wherein the second interposer is provided at an edge of the specific area.

3. The display device of claim 2, wherein the second interposer further including the row driver is provided along a column-direction edge in the specific area.

4. The display device of claim 3, wherein the specific area includes the second interposer further including the row driver along both column-direction edges.

5. The display device of claim 2, wherein the second interposer further including the column driver is provided along a row-direction edge in the specific area.

6. The display device of claim 5, wherein the specific area includes the second interposer further including the column driver along both row-direction edges.

7. The display device of claim 2, wherein the second interposer including both the column driver and the row driver is provided at an edge in the specific area.

8. The display device of claim 2, wherein the specific area is provided in plural, and
wherein an area of the base substrate is divided to configure the plurality of specific areas.

9. The display device of claim 8, wherein, when a number of rows formed by a plurality of semiconductor light emitting elements including the semiconductor light emitting element is equal to or greater than a predetermined number, the base substrate includes the plurality of specific areas in a column direction.

10. The display device of claim 8, wherein, when a number of columns formed a plurality of semiconductor light emitting elements including the semiconductor light emitting element is equal to or greater than a predetermined number, the base substrate includes the plurality of specific areas in a row direction.

11. The display device of claim 1, wherein the row driver provides a same first signal to a plurality of IC chips including the IC chip arranged in a row direction in the specific area.

12. The display device of claim 1, wherein the column driver provides a same second signal to a plurality of IC chips including the IC chip arranged in a column direction in the specific area.

13. The display device of claim 1, wherein the IC chip provides a light emitting signal to the semiconductor light emitting element included in an interposer among the first interposer and the second interposer in response to signals provided by the row driver and the column driver.

14. The display device of claim 1, wherein the semiconductor light emitting element of the basic component is included in a semiconductor light emitting element set including a red light semiconductor light emitting element, a blue light semiconductor light emitting element, and a green light semiconductor light emitting element as a unit pixel.

15. The display device of claim 14, wherein the basic component includes a plurality of semiconductor light emitting element sets including the semiconductor light emitting element set.

16. A display device using a semiconductor light emitting element, the display device comprising:
a base substrate;
a first interposer provided on the base substrate and including a plurality of semiconductor light emitting elements corresponding to a unit pixel and an integrated circuit (IC) chip as a basic component; and
a second interposer further including at least one of a row driver and a column driver in addition to the basic component,
wherein the IC chip provides a light emitting signal to the semiconductor light emitting element included in an interposer in response to the signal provided by the row driver and the column driver,
wherein the first interposer is provided within a first area of the base substrate, and wherein the second interposer is provided at an edge of the first area, and
wherein the at least one of the row driver and the column driver of the second interposer is directly connected to a pin of the IC chip of the first interposer via a wire of the second interposer.

17. The display device of claim 16, wherein the second interposer including the row driver is provided along a column-direction edge in the first area.

18. The display device of claim 16, wherein the first area including the row driver is disposed along both column-direction edges in the first area.

19. The display device of claim 16, wherein the second interposer including the column driver is provided along a row-direction edge in the first area.

20. The display device of claim 16, wherein the second interposer including both the column driver and the row driver is provided at an edge in the first area.

21. The display device of claim 1, wherein the second interposer is provided in plural,
wherein the plurality of second interposers each including the row driver are arranged in a first series in a first direction,
wherein the plurality of second interposers each including the column driver are arranged in a second series in a second direction, and
wherein one second interposer including both the row driver and the column driver of the plurality of second interposers is disposed at an intersection of the first series and the second series.

* * * * *